US011611163B2

(12) United States Patent
Cherian (10) Patent No.: US 11,611,163 B2
(45) Date of Patent: Mar. 21, 2023

(54) CONFIGURABLE SAFETY GROUND TERMINALS FOR INDUSTRIAL APPLICATIONS

(71) Applicant: Honeywell International Inc., Morris Plains, NJ (US)

(72) Inventor: Jaison Cherian, Karnataka (IN)

(73) Assignee: Honeywell International Inc., Charlotte, NC (US)

( * ) Notice: Subject to any disclaimer, the term of this patent is extended or adjusted under 35 U.S.C. 154(b) by 51 days.

(21) Appl. No.: 17/216,888

(22) Filed: Mar. 30, 2021

(65) Prior Publication Data
US 2021/0399445 A1 Dec. 23, 2021

Related U.S. Application Data

(60) Provisional application No. 63/042,149, filed on Jun. 22, 2020.

(51) Int. Cl.
*H01R 9/24* (2006.01)
*G05B 9/02* (2006.01)
(Continued)

(52) U.S. Cl.
CPC ............ *H01R 9/2483* (2013.01); *G05B 9/02* (2013.01); *G05B 19/0425* (2013.01);
(Continued)

(58) Field of Classification Search
CPC ........ H01R 9/2466; H01R 4/646; H01R 4/66; H01R 13/40; H01R 13/648; H01R 13/70; H05K 7/1482; H05K 7/1468
See application file for complete search history.

(56) References Cited

U.S. PATENT DOCUMENTS 6,008,985 A 12/1999 Lake et al.
8,570,922 B2 10/2013 Pratt, Jr. et al.
(Continued)

FOREIGN PATENT DOCUMENTS

CN 103354190 A 10/2013
CN 104241972 * 12/2014
(Continued)

OTHER PUBLICATIONS

First Examination Report for corresponding Indian Application No. 202114024469.
(Continued)

*Primary Examiner* — Jean F Duverne
(74) *Attorney, Agent, or Firm* — Ortiz & Lopez, PLLC; Luis M. Ortiz; Kermit D. Lopez (57) ABSTRACT

A safety ground terminal apparatus can include a ground terminal operable to switch between a common ground connection or a isolated ground connection, wherein the ground terminal comprises a hinge point that is connectable to a base of a housing via a rail in an arrangement that allows for a disconnection from the common ground connection when the isolated ground connection is required and without compromising electrical contact. The ground terminal can provide a watertight ground connection irrespective of the type of ground connection requirement. The common ground connection or the isolated ground connection can be achieved without any additional parts assembled.

20 Claims, 7 Drawing Sheets

(51) Int. Cl.
*G05B 19/042* (2006.01)
*H01R 13/50* (2006.01)
*H01R 13/52* (2006.01)

(52) U.S. Cl.
CPC ......... *H01R 9/2466* (2013.01); *H01R 13/501* (2013.01); *H01R 13/52* (2013.01)

(56) References Cited

U.S. PATENT DOCUMENTS

| | | | |
|---|---|---|---|
| 8,676,219 | B2 | 3/2014 | Pratt, Jr. et al. |
| 10,296,515 | B2 | 5/2019 | Nikhra et al. |
| 10,354,343 | B2 | 7/2019 | Bodanapu et al. |
| 2007/0100472 | A1 | 5/2007 | Johnson et al. |
| 2010/0315298 | A1 | 12/2010 | Biswas et al. |
| 2012/0300420 | A1 | 11/2012 | Muldowney et al. |
| 2020/0127411 | A1* | 4/2020 | Pakimo .................. H01R 12/55 |
| 2020/0253067 | A1* | 8/2020 | Pakimo .................. H05K 7/023 |

FOREIGN PATENT DOCUMENTS

| | | |
|---|---|---|
| EP | 2483977 A1 | 8/2012 |
| IN | 102077420 A | 5/2011 |

OTHER PUBLICATIONS

Wikipedia, "DNA Rail"; Retrieved from "https://en.wikipedia.org/w/index.php?title=DIN_rail&oldid=946791884", Mar. 22, 2020.

"Everything You Need to Know About DIN Rails", RS Components, downloaded Apr. 21, 2020, https://uk.rs-online.com.

Honeywell, High-Performance Process Manager Planning, HP02-500, Release 530, CE Compliant, Revision 05—Mar. 20, 1998.

Arnold Offner, "DIN-Rail in the Electrical Control Cabinet and Junction Box", Presented on Nov. 12, 2008 at the IEEE SC2 Committee Meeting in Tucson, Arizona.

* cited by examiner

CONFIGURABLE SAFETY GROUND TERMINALS FOR INDUSTRIAL APPLICATIONS

CROSS-REFERENCE TO PROVISIONAL APPLICATION

This patent application claims priority under 35 U.S.C. § 119(e) to U.S. Provisional Patent Application Ser. No. 63/042,149 entitled "Configurable Safety Ground Terminals for Industrial Applications," which was filed on Jun. 22, 2020, the disclosure of which is incorporated herein by reference in its entirety.

TECHNICAL FIELD

Embodiments relate to industrial control and safety systems. Embodiments also relate to marshalling cabinets and equipment racks utilized to maintain electronic hardware and other components for industrial control and safety systems. Embodiments further relate to configurable safety ground terminals utilized in industrial control and safety systems.

BACKGROUND

Industrial control and safety systems often include the use of marshalling cabinets to interface wiring and/or cabling from a field device with input/output (I/O) devices. All I/Os can be grouped in a marshalling panel associated with the marshalling cabinet. Examples of I/Os include Analog Input, Analog Output, Digital Input, Digital Output and Pulse I/O. The I/O signals can be conveyed to CPU/Controllers via insulation/signal conditioners from the marshalling panel.

In a marshalling cabinet, I/Os can be identified easily, with inputs from the backside of the marshalling panel and output to the CPU from the front side. For each of these I/O signals within a single cabinet there are a wide variety of devices, third-party components, termination assemblies, wires, and cable markers that need to be taken into account during engineering and design of the cabinet including issues related to ground termination.

Industrial organizations spend millions of dollars per year in the manual effort of wiring or reconfiguring marshalling cabinets per customer requirements. The ground termination is an integral part of these cabinet assemblies and the method of grounding them is critical and labor intensive. There are different methods for providing the ground, which depend on the use case. It is a challenge to provide suitable safety grounding options without nullifying any of the existing compliance/certificates. Solving safety ground requirements with just one method of connecting ground has become virtually impossible without compromising on product aesthetics, cost and usability concerns.

In some default cases, the safety ground may be connected through a DIN rail on which hardware will be mounted. This technique for connecting a safety ground is acceptable in some marshalling cabinet installations, because it can be accomplished with limited complexity and relatively low labor requirements. In certain other types of installations (e.g., dependent on geography, customers as well as other third party hardware, which is a part of the cabinet installation), however, passing the safety ground through the DIN rail is not an acceptable approach because such connections can nullify some of the isolations between the field side and control hardware.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the disclosed embodiments to provide for improved industrial control and safety devices, systems and methods.

It is another aspect of the disclosed embodiments to provide for methods and systems for improved ground connections for marshalling cabinets and equipment racks used to maintain electronic hardware and other components for industrial control and safety systems.

It is a further aspect of the disclosed embodiments to provide for configurable safety ground terminals utilized in industrial control and safety systems and industrial applications.

The aforementioned aspects and other objectives can now be achieved as described herein. In an embodiment, a safety ground terminal apparatus can include a ground terminal operable to switch between a common ground connection or a isolated ground connection, wherein the ground terminal comprises a hinge point that is connectable to a base of a housing via a rail in an arrangement that allows for a disconnection from the common ground connection when the isolated ground connection is required and without compromising electrical contact.

In an embodiment of the safety ground terminal apparatus, the rail can comprise a DIN rail.

In an embodiment of the safety ground terminal apparatus, the ground terminal can provide a watertight ground connection irrespective of a type of ground connection requirement.

In an embodiment of the safety ground terminal apparatus, the housing can comprise a cabinet such as a marshalling cabinet for maintaining electrical equipment.

In an embodiment of the safety ground terminal apparatus, housing can comprise a chassis.

In an embodiment of the safety ground terminal apparatus, a separate ground wire with a lug can be provided, which is connectable to a printed wire assembly via a clinch fastener arrangement in, for example, a printed circuit board maintained by the housing.

In an embodiment of the safety ground terminal apparatus, the base can comprise an FTA (Field Termination Assembly) base.

In an embodiment of the safety ground terminal apparatus, switching between the common ground connection or the isolated ground connection can be achieved without any additional parts assembled.

In an embodiment of the safety ground terminal apparatus, a switchable ground strip can provide a visual indication of which ground is connected including the common ground connection or the isolated ground connection.

In another embodiment, a system can include a grounding arrangement comprising a plurality of ground connections; and a ground terminal operable to switch between at least one common ground connection or at least one isolated ground connection among the plurality of ground connections, wherein the ground terminal comprises a hinge point that is connectable to a base of a housing via a rail in an arrangement that allows for a disconnection from the at least one common ground connection when the at least one isolated ground connection is required and without compromising electrical contact.

In an embodiment of the system, the grounding arrangement can be securable to avoid accidental switching of a ground connection among the plurality of ground connections when the system is active.

In an embodiment of the system, the ground terminal can provide a watertight ground connection irrespective of a type of ground connection requirement.

In an embodiment of the system, a separate ground wire with a lug can be provided, which is connectable to a printed wire assembly via clinch fastener arrangement in a printed circuit board maintained by the housing.

In an embodiment of the system, the base can comprise an FTA (Field Termination Assembly) base and the rail can comprise a DIN rail.

In an embodiment of the system, switching between the common ground connection or the isolated ground connection can be achieved without any additional parts assembled.

In an embodiment of the system, a switchable ground strip can provide a visual indication of which ground is connected including the common ground connection or the isolated ground connection.

In another embodiment, a method of operating a safety ground terminal apparatus, can involve switching a ground terminal between a common ground connection or an isolated ground connection, wherein the ground terminal comprises a hinge point that is connectable to a base of a housing via a rail in an arrangement that allows for a disconnection from the common ground connection when the isolated ground connection is required and without compromising electrical contact.

In an embodiment of the method, the switching between the common ground connection or the isolated ground connection can be achieved without any additional parts assembled.

An embodiment of the method can further involve using a switchable ground strip for a visual indication of which ground is connected including the common ground connection or the isolated ground connection.

In an embodiment of the method, the ground terminal can provide a watertight ground connection irrespective of a type of ground connection requirement.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As noted above, industrial process control and automation systems typically have hardware components participating in various control and input/output (I/O) functions. Marshalling cabinets, for example, can been used to gather the various components for communicating over I/O channels into a single location. These components can include equipment used for functions such as field cable descrambling, signal conditioning, protection, and disconnect hardware and energy-limiting barriers for field devices. Often times, the various components may be arranged serially, with different columns of equipment performing different functions and with components in the different columns connected by wiring.

Such marshalling solutions used in industrial process control and automation systems may require different types of ground connections. The disclosed embodiments generally relate to a configurable safety ground terminal apparatus for use in industrial applications. As will be discussed in greater detail, the configurable safety ground terminal apparatus can provide flexibility to technicians to make an easy switch between a common ground connection and an isolated ground connection. As will be discussed in greater detail below, the ground terminal can operate by a hinge method that can enable an operator to make a connection to, for example, a chassis/cabinet ground via a rail (e.g., a DIN rail) without any compromise to the electrical contact while also allowing for disconnection from that common ground when an isolated ground connection is needed. A separate ground wire with a lug can be connected to a printed wire assembly via a clinch nut arrangement in a printed circuit board.

Figure 1:
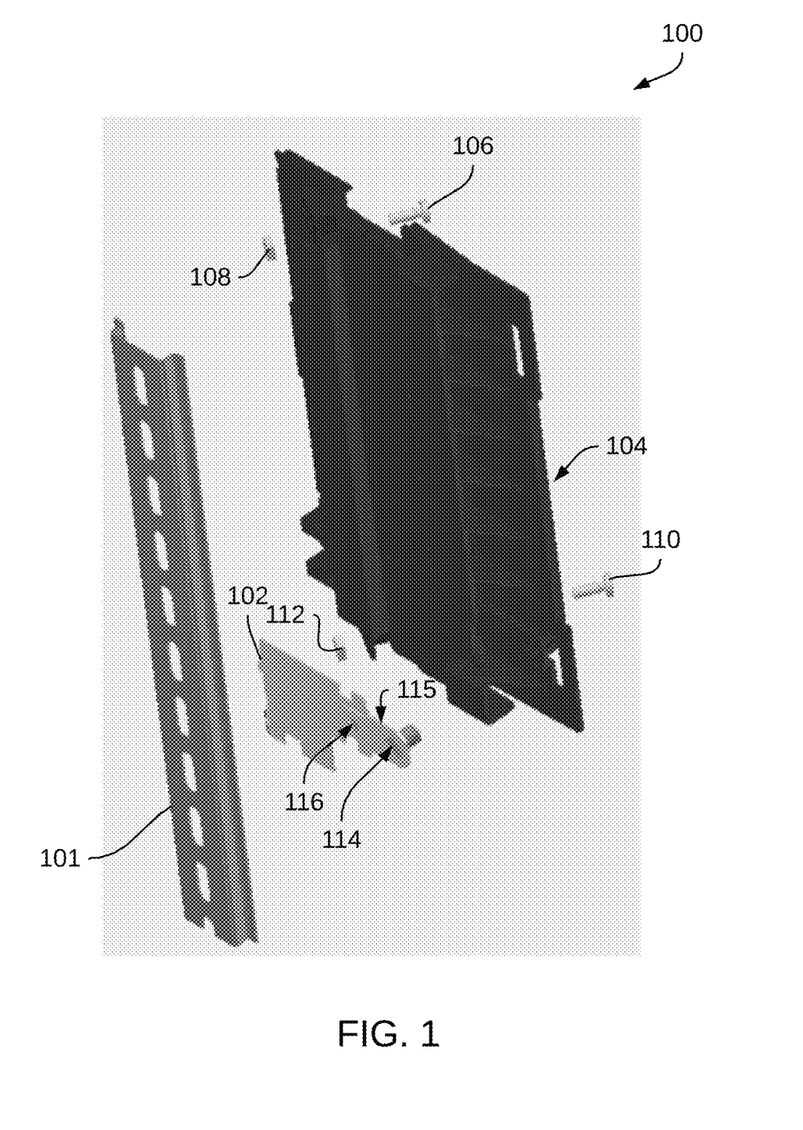
FIG. 1 illustrates an exploded view of a safety ground terminal apparatus including a rail, a ground terminal and a base, in accordance with an embodiment.

FIG. 1 illustrates an exploded view of a safety ground terminal apparatus 100 that can include a rail 101, a ground terminal 102 and a base 104, in accordance with an embodiment. The safety ground terminal apparatus 100 can be implemented in the context of an industrial process control and automation system such as the industrial process control and automation system 400 depicted in FIG. 9.

The ground terminal 102 of the safety ground terminal apparatus 100 is operable to switch between a common ground connection or an isolated ground connection. The ground terminal 102 can include a hinge point 116 that is connectable to the base 104 via the rail 101 in an arrangement that allows for a disconnection from the common ground connection when the isolated ground connection is required and without compromising electrical contact. The hinge point 116 allows for movement of a circular protruding portion 115 that can maintain a screw 114. The ground terminal 102 can be configured to provide a watertight ground connection irrespective of the type of ground connection requirement.

The base 104 can be a base of a housing (e.g. an equipment rack, chassis/cabinet, marshalling cabinet, control cabinet, etc). One example of a base that can be utilized as the base 104 is an FTA (Field Termination Assembly) base, which can be mounted on the rail 101 of a housing and can be used to connect, for example, individual actuators or sensors in a field zone to corresponding I/O modules. Note that the base 104 can include any suitable structure configured to be coupled to a support and to receive and retain a field termination assembly housing. The base 104 can be formed from any suitable material(s), such as but not limited to ruggedized plastic. The base 104 can also be formed in any suitable manner, such as by using injection molding, machining, or additive manufacturing. In addition, the base 104 can have any suitable size, shape, and dimensions. In some embodiments, the base 104 may be formed of metal, but this may require the addition of an insulator between the base 104 and, for example, the PWA 210 shown in FIG. 5.

The rail 101 can be provided as a metal rail used for mounting circuit breakers and industrial equipment inside an equipment rack (or multiple equipment racks), an also providing a chassis grounding connection. One example of a rail that can be used as the rail 101 is a DIN (Deutsches Institut für Normung). The term DIN derives from the original specifications published by Deutsches Institut für Normung (DIN) in Germany, which have since been adopted as European (EN) and international (IEC) standards. The rail 101 may be configured from a cold rolled carbon steel sheet with a zinc-plated or chromated bright surface. Although metallic, the rail 101 is meant for mechanical support, and not as a busbar to conduct electric current, can provide a chassis grounding connection as mentioned above. It should be appreciated that aforementioned reference to a DIN rail and an FTA is not considered a limiting feature of the disclosed embodiments, but is presented herein for exemplary and edification purposes.

Figure 5:
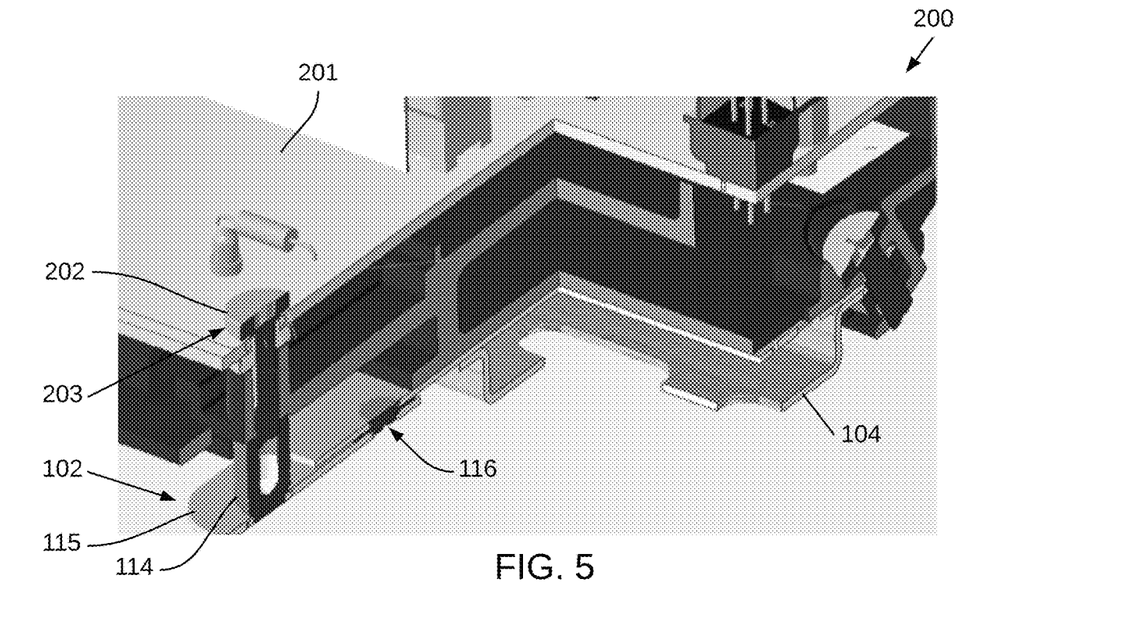
FIG. 5 illustrates a perspective pictorial view of a configurable safety ground terminal system in which the base is arranged in a manner in which the ground terminal is connected to a common ground, in accordance with an embodiment.
Figure 6:
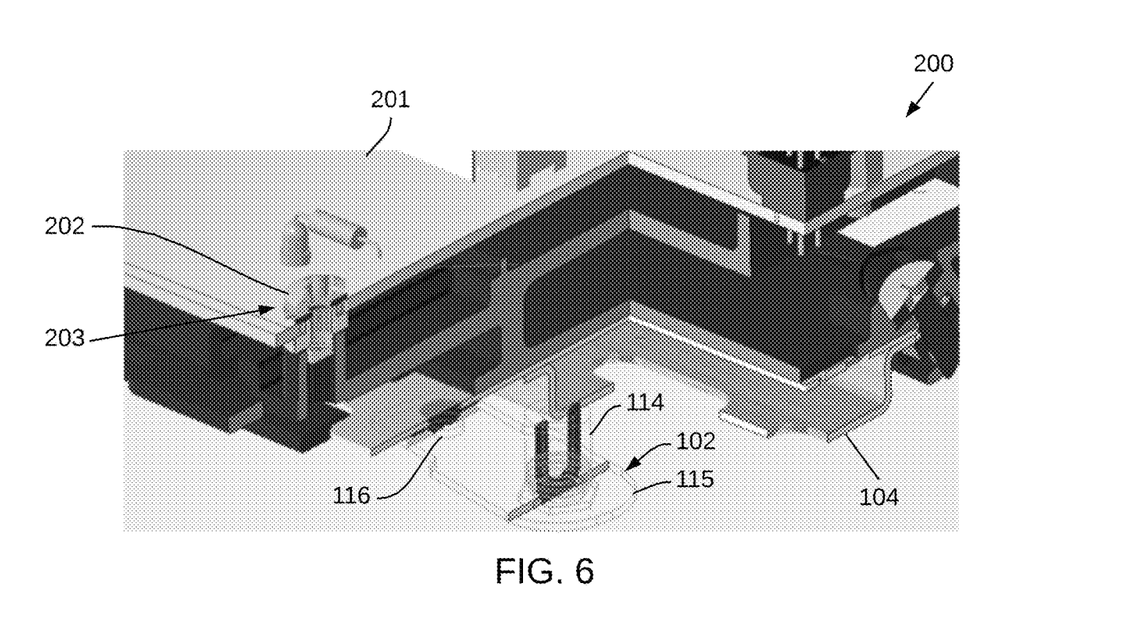
FIG. 6 illustrates a perspective pictorial view of a configurable safety ground terminal system in which the base is arranged in a manner in which the ground terminal is now connected from the common ground, in accordance with an embodiment.

The safety ground terminal apparatus 100 thus operates as a ground connector with a hinge method that can an enable an operator to connect the safety ground terminal apparatus 100 to a housing (e.g. chassis/cabinet) ground via the rail 101. As will be discussed in more detail herein, this arrangement can be disconnected from this ground when an isolated ground connection is needed and a separate ground wire can be connected via a clinch nut configuration (e.g., as shown in FIG. 5 and FIG. 6)

Figure 2:
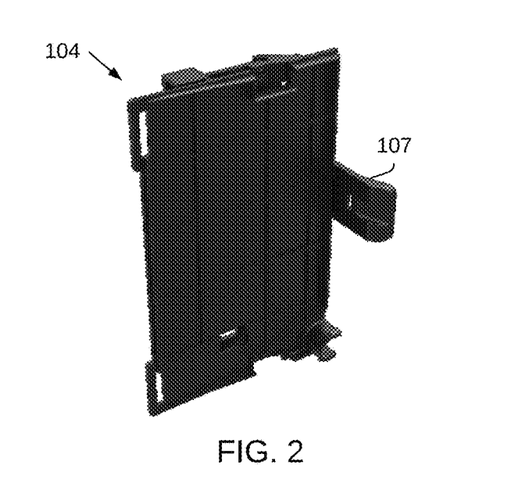
FIG. 2 illustrates a perspective view of a base of a safety ground terminal apparatus, in accordance with an embodiment.

FIG. 2 illustrates a perspective view of the base 104 of the safety ground terminal apparatus 100 shown in FIG. 1, in accordance with an embodiment. Note that in the figures illustrated and discussed herein, identical or similar parts are components are indicated by identical reference numerals. The view of the base 104 shown in FIG. 2 indicates that the base 104 can also be configured with a tab portion 107 that facilitates connection of the base 104 to other components.

Figure 3A:
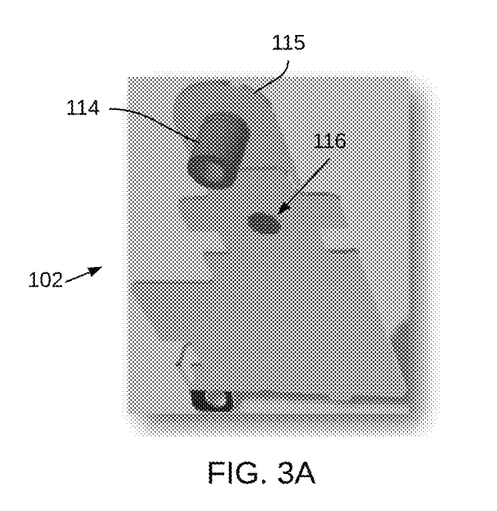
FIG. 3A illustrates a perspective view of a ground terminal in a first position with a hinge point, in accordance with an embodiment.
Figure 3B:
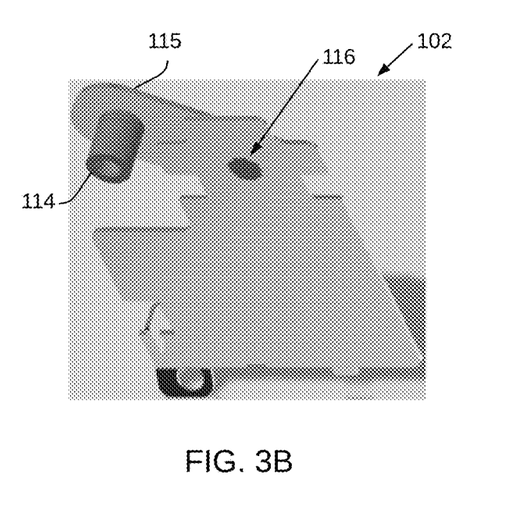
FIG. 3B illustrates a perspective view of the ground terminal shown in FIG. 2B with a hinge point in a second position, in accordance with an embodiment.

FIG. 3A illustrates a perspective view of the ground terminal 102 with the circular protruding portion 115 in a first position with respect to the hinge point 116, in accordance with an embodiment. FIG. 3B illustrates a perspective view of the ground terminal 102 with the circular protruding portion 115 in a second position with respect to the hinge point 116, in accordance with an embodiment.

Figure 4A:
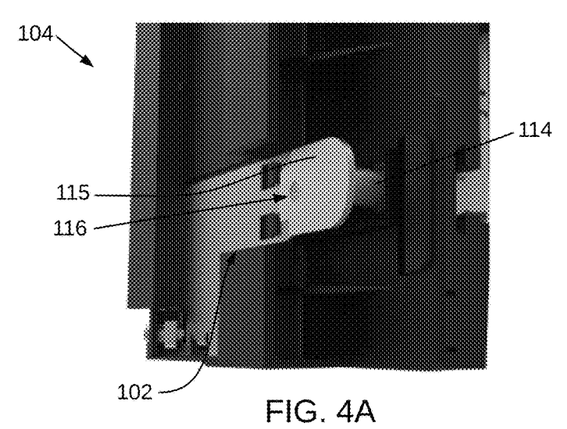
FIG. 4A illustrates an image of the ground terminal assembled to the base, in accordance with an embodiment.
Figure 4B:
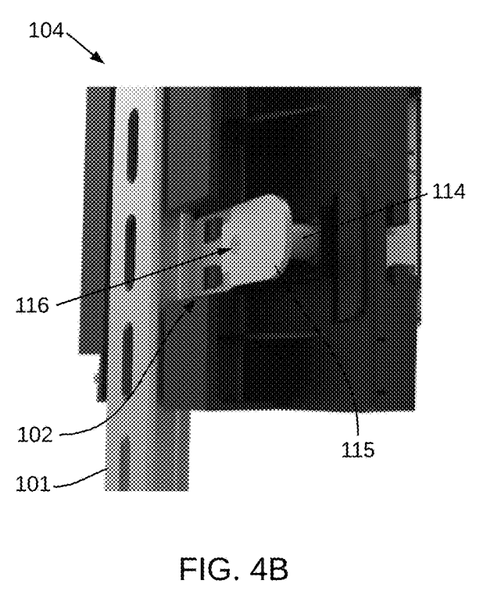
FIG. 4B illustrates an image of the base with the ground terminal connected to a common ground, in accordance with an embodiment.
Figure 4C:
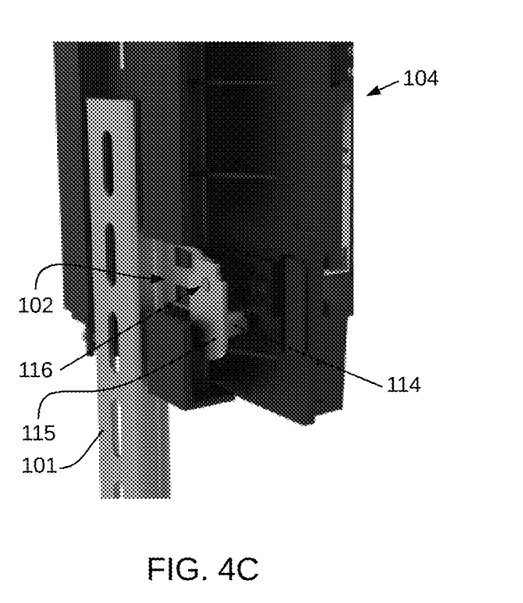
FIG. 4C illustrates an image of the base with the ground terminal disconnected to the common ground, in accordance with an embodiment.

FIG. 4A illustrates an image of the ground terminal 102 assembled to the base 104, in accordance with an embodiment. FIG. 4B illustrates an image of the base 104 with the ground terminal 102 connected to a common ground, in accordance with an embodiment. FIG. 4C illustrates an image of the base 104 with the ground terminal 102 disconnected to the common ground, in accordance with an embodiment. Note that in FIGS. 4B and 4C, the rail 101 is shown with respect to the ground terminal 102, but is not shown in FIG. 4A.

FIG. 5 illustrates a perspective pictorial view of a configurable safety ground terminal system 200 in which the base 104 is arranged in a manner in which the ground terminal 102 is connected to a common ground, in accordance with an embodiment. As shown in FIG. 5, a PWA (Printed Wiring Assembly) 201 engages a screw 202 that in turn connects to a clinch nut 203 on the PWA 201. As shown in FIG. 5, the circular protruding portion 115 is shown with respect to the hinge point 116 in a first position. As discussed previously, the hinge point 116 allows for movement of the circular protruding portion 115 (which also maintains the screw 114).

FIG. 6 illustrates a perspective pictorial view of a configurable safety ground terminal system 200 in which the base 104 is arranged in a manner in which the ground terminal 102 is now connected from the common ground, in accordance with an embodiment. That is, as shown in FIG. 6, the circular protruding portion 115 has now moved from its previous position as shown in FIG. 5. Thus, FIG. 6 depicts the base 104 with the ground terminal 102 disconnected from the common ground. Note that the configurable safety ground terminal system 200 discussed herein with respect to FIG. 5, FIG. 6, and FIG. 7 can be implemented in the context of an industrial process control and automation system such as the industrial process control and automation system 400 shown in FIG. 9.

Figure 7:
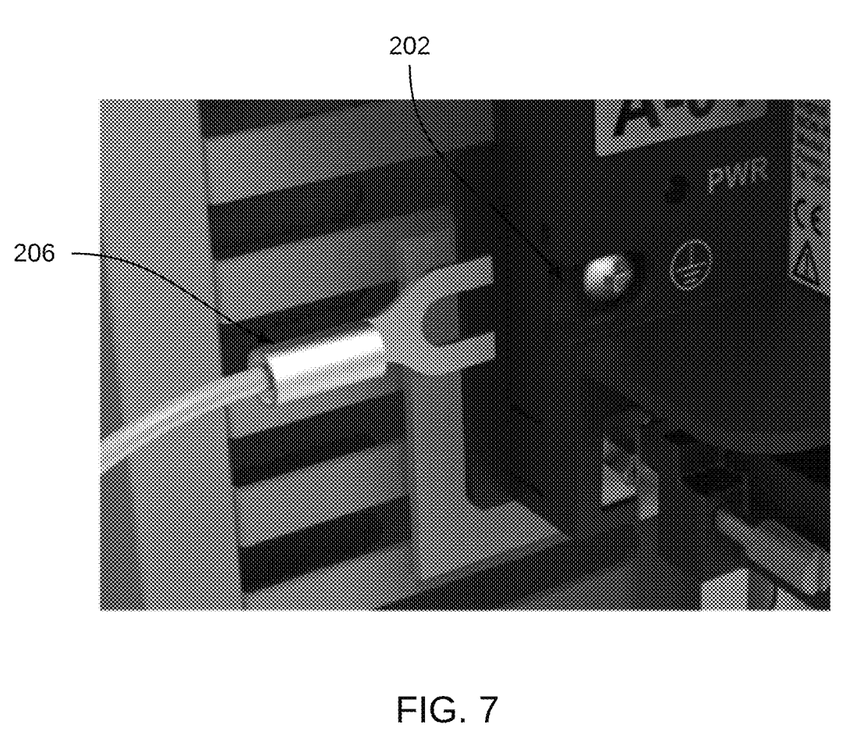
FIG. 7 illustrates an image of a ground connection for the configurable safety ground terminal system using a lug and wire device, in accordance with an embodiment.

FIG. 7 illustrates an image of a ground connection for the configurable safety ground terminal system 200 using a lug and wire device 206, in accordance with an embodiment. FIG. 7 depicts a close up view of a portion of the configurable safety ground terminal system 200 shown in FIG. 5 and FIG. 6. As shown in FIG. 7, the lug and wire device 206 can connect to the screw 202, which facilitates grounding. It can be appreciated the assembly illustrated with respect to FIGS. 1-7 and as described above provides for an integrated water tight ground connection, which can also enable easy switching between a common ground connection to an isolated ground connection within the mechanical housing of, for example, an FTA designed for marshalling solutions.

Figure 8:
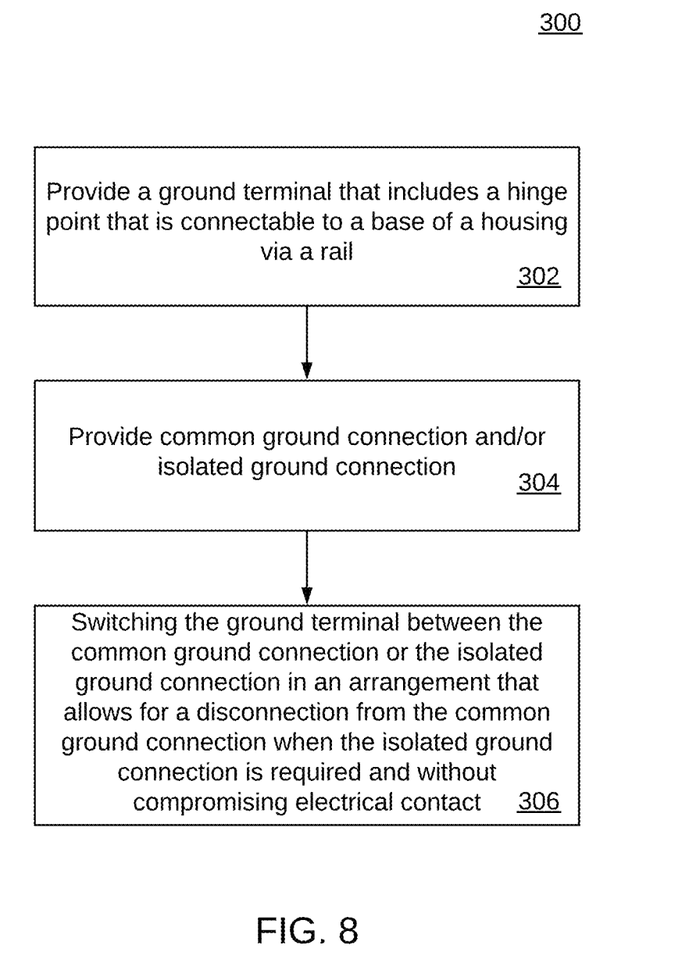
FIG. 8 illustrates a method of operating the safety ground terminal apparatus, in accordance with an embodiment.

FIG. 8 illustrates a method 300 of operating the safety ground terminal apparatus 100, in accordance with an embodiment. Note that the method 300 can be implemented in the context of an industrial process control and automation system such as the industrial process control and automation system 400 shown in FIG. 9. As depicted at block 302, a step or operation can be implemented in which the ground terminal 102 is provided with the hinge point 116, which is connectable to the base 104 of a housing (e.g., chassis/cabinet, equipment rack etc.) via a rail 101. Next, as illustrated at block 304, a common ground connection and/or an isolated ground connection can be provided. Thereafter, as shown at block 306 a step or operation can be implemented for switching the ground terminal 102 between the aforementioned common ground connection or the isolated ground connection.

As discussed previously, the ground terminal 102 and the hinge point that 116 are connectable to the base 104 of the housing via the rail 101 in an arrangement that allows for disconnection from the common ground connection when the isolated ground connection is required and without compromising electrical contact. The switching between the common ground connection or the isolated ground connection can be achieved without any additional parts assembled. Additionally, the use of method 300 can facilitate a watertight ground connection irrespective of any ground connection requirement.

Figure 9:
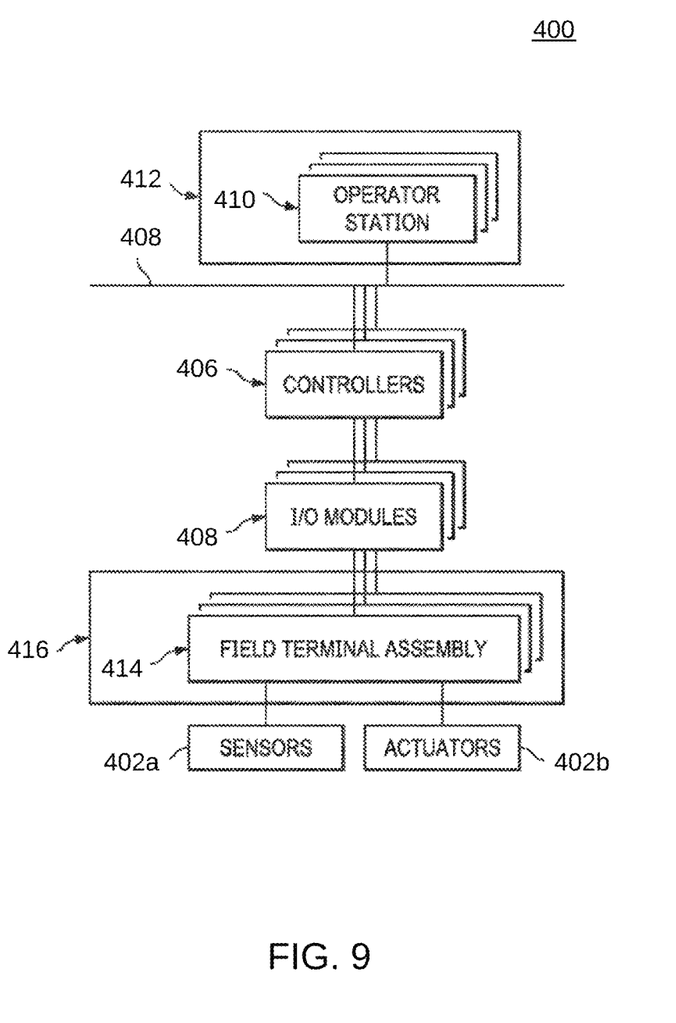
FIG. 9 illustrates an example industrial process control and automation system, in accordance with an embodiment.

FIG. 9 illustrates an example industrial process control and automation system 400, in accordance with an embodiment. As shown in FIG. 9, the industrial process control and automation system 400 can include various components that can facilitate production or processing of at least one product or other material. For instance, the industrial process control and automation system 400 can be used to facilitate control or monitoring of components in one or multiple industrial plants. Each plant represents one or more processing facilities (or one or more portions thereof), such as one or more manufacturing facilities for producing at least one product or other material. In general, each plant may implement one or more industrial processes and can individually or collectively be referred to as a process system. A process system generally represents any system or portion thereof configured to process one or more products or other materials or energy in different forms in some manner.

In the example shown in FIG. 9, the industrial process control and automation system 400 can include one or more sensors 402a and one or more actuators 402b. The sensors 402a and actuators 402b represent components in a process system that may perform any of a wide variety of functions. For example, the sensors 402a could measure a wide variety of characteristics in the process system, such as temperature, pressure, or flow rate. Also, the actuators 402b could alter a wide variety of characteristics in the process system. Each of the sensors 402a can include any suitable structure for measuring one or more characteristics in a process system. Each of the actuators 402b can include any suitable structure for operating on or affecting one or more conditions in a process system.

At least one I/O module 1404 can be coupled to the sensors 402a and actuators 402b. The I/O modules 104 facilitate interactions with the sensors 402a, actuators 402b, or other field devices. For example, an I/O module 404 could be used to receive one or more analog inputs (AIs), digital inputs (DIs), digital input sequences of events (DISOEs), pulse accumulator inputs (PIs), or other inputs from one or more field devices. An I/O module 104 could also be used to provide one or more analog outputs (AOs), digital outputs (DOs), or other outputs to one or more field devices. As described below, the interactions with one or more field devices could occur through at least one (or more) field termination assembly (FTA) 414. Each I/O module 404 can include any suitable structure(s) for receiving one or more input signals from or providing one or more output signals to one or more field devices.

The industrial process control and automation system 400 can also include various controllers 406. The controllers 406 can be used in the industrial process control and automation system 400 to perform various functions in order to control one or more industrial processes. For example, a first set of controllers 406 may use measurements from one or more sensors 402a to control the operation of one or more actuators 402b. These controllers 406 could interact with the sensors 402a, actuators 402b, and other field devices via the I/O modules 404. A second set of controllers 406 could be used to optimize the control logic or other operations performed by the first set of controllers. A third set of controllers 406 could be used to perform additional functions. It is also possible that one set of controllers could be in a stand-by or load-sharing mode to improve overall availability of the system.

Controllers 406 may be arranged hierarchically in a system. For example, different controllers 406 could be used to control individual actuators, collections of actuators forming machines, collections of machines forming units, collections of units forming plants, and collections of plants forming an enterprise. The controllers 406 in different hierarchical levels can communicate via one or more networks 408 and associated switches, firewalls, and other components.

Each controller 406 can include any suitable structure for controlling one or more aspects of an industrial process. At least some of the controllers 406 could, for example, represent proportional-integral-derivative (PID) controllers or multivariable controllers, such as Robust Multivariable Predictive Control Technology (RMPCT) controllers or other types of controllers implementing model predictive control (MPC) or other advanced predictive control. As a particular example, each controller 406 could represent a computing device running a real-time operating system, a WINDOWS operating system, or other operating system.

The one or more networks 408 can couple the controllers 406 and other devices in the industrial process control and automation system 400. The network 408 can facilitate the transport of information between components. The network 408 can represent any suitable network or a combination of networks. As a particular example, the network 408 can represent at least one Ethernet network. In other scenarios, the network 408 may be implemented as a wireless communications network (e.g., a cellular communication network, a WiFi network, a HART (Highway Addressable Remote Transducer Protocol), and so on).

Operator access to and interaction with the controllers 406 and other components of the industrial process control and automation system 400 can occur via various operator stations 410. Each operator station 410 could be used to provide information to an operator and receive information from an operator. For example, each operator station 410 could provide information identifying a current state of an industrial process to an operator, such as values of various process variables and warnings, alarms, or other states associated with the industrial process. Each operator station 410 can also receive information affecting how the industrial process may be controlled, such as by receiving setpoints for process variables controlled by the controllers 406 or other information that can alerter or affect how the controllers 406 can control the industrial process. Each operator station 410 can include any suitable structure for displaying information to and interacting with an operator.

Multiple operator stations 410 can be grouped together and used in one or more control rooms 412. Each control room 412 can include any number of operator stations 410 in any suitable arrangement. In some embodiments, multiple control rooms 412 can be used to control an industrial plant, such as when each control room 412 contains operator stations 410 used to manage a discrete part of the industrial plant.

This represents a brief description of one type of industrial process control and automation system that may be used to manufacture or process one or more materials and in which one or more embodiments may be implemented. Additional details regarding industrial process control and automation systems are well-known in the art and are not needed for an understanding of this disclosure. Also, industrial process control and automation systems are highly configurable and can be configured in any suitable manner according to particular needs.

In some embodiments, the various controllers 406 and operator stations 410 shown in FIG. 9 may represent computing devices. For example, each of the controllers and operator stations could include one or more processing devices, such as one or more microprocessors, microcontrollers, digital signal processors (DSPs), field programmable gate arrays (FPGAs), application specific integrated circuits (ASICs), or discrete circuitry. Each of the controllers 406 and operator stations 410 could also include one or more memories for storing instructions and data used, generated, or collected by the processing device(s), such as a random access memory, read only memory, Flash memory, optical disc, hard drive, or any other suitable volatile or non-volatile storage device(s). Each of the controllers 406 and operator stations 410 could further include at least one network interface, such as one or more Ethernet interfaces or wireless transceivers.

In process control and automation systems such as the industrial process control and automation system 400, I/O channels can be used to connect controllers (such as the controllers 406) and field devices (such as the sensors 402a and actuators 402b). In general, the I/O modules 404 or other devices can support I/O channels of various types, including AIs, DIs, DISOEs, PIs, AOs, or DOs. Different I/O channel types can be characterized by different inputs, outputs, voltages, currents, and configurations. A universal I/O (UIO) channel can be a specialized I/O channel that can be reconfigurable to operate as any of multiple I/O channel types.

As described in more detail below, at least one field termination assembly 414 can be used in the industrial process control and automation system 400 or other systems. Each field termination assembly 414 can include one or more slots configured to receive one or more adaptor modules for one or more I/O channels, such as sixteen adaptor modules for sixteen I/O channels (although other numbers of adaptor modules and I/O channels can be supported). Each adaptor module can perform one or more functions related to I/O signals, such as signal conditioning, energy limiting, galvanic isolation, or protection (or any combination thereof). The adaptor modules can operate independently, meaning each adaptor module can perform its function(s) for its I/O channel regardless of whether other adaptor modules are present or what those other adaptor modules are doing.

In some embodiments, the slots of a field termination assembly 414 may be universal; meaning different types of adaptor modules can be inserted into the slots of the field termination assembly 414. This may allow, for example, different adaptor modules to be designed for different types of I/O channels, such as different adaptor modules for AIs, DIs, DISOEs, PIs, AOs, and DOs. This may also allow different adaptor modules supporting different types of signal conditioning, intrinsic safety, galvanic isolation, protection, or other hardware functions to be designed. In general, any suitable adaptor modules can be used in a field termination assembly 414, and the field termination assembly 414 can include one or multiple types of adaptor modules. Note that a non-limiting example of an FTA that may be utilized to implement the field termination assembly 414, is shown and discussed in U.S. Patent Application Publication No. 20200127411 entitled "Field Termination Assembly Supporting Use of Mistake-Proof Keys" which was published on Apr. 23, 2020, and is incorporated herein by reference in its entirety. U.S. Patent Application Publication No. 20200127411 is assigned to Honeywell International Inc.

The embodiments discussed herein offer a number of solutions. For example, the disclosed approach can provide flexibility to the technicians to easily and quickly switch between the common ground termination or the isolated ground connection. In addition, a watertight ground connection can be implemented irrespective of the type of ground connection requirement. This approach can also meet all necessary certification and compliance needs, while reducing lengthy assembly time. This approach also may not impact the rest of the design, tooling and product aesthetics. Changes may also not be required with respect to standard wiring practices that many project teams follow today.

It will be appreciated that variations of the above-disclosed embodiments and examples and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A safety ground terminal apparatus, comprising:

a rail;

a base of a housing; and a ground terminal operable to switch between a common ground connection or an isolated ground connection, wherein the ground terminal comprises a hinge point that is connectable to the base of the housing via the rail in an arrangement that allows for a disconnection from the common ground connection when the isolated ground connection is required and without compromising electrical contact, wherein the base is arranged in a manner such that the hinge point allows for a movement of a circular protruding portion to maintain a screw to connect the ground terminal with the common ground connection, and wherein when the isolated ground connection is required, a separate ground wire is connected via a clinch nut configuration.

2. The safety ground terminal apparatus of claim 1 wherein the rail comprises a DIN rail.

3. The safety ground terminal apparatus of claim 1 wherein the ground terminal provides a watertight ground connection irrespective of a type of ground connection requirement.

4. The safety ground terminal apparatus of claim 1 wherein the housing comprises a cabinet for maintaining electrical equipment.

5. The safety ground terminal apparatus of claim 1 wherein the housing comprises a chassis.

6. The safety ground terminal apparatus of claim 1 further comprising a separate ground wire with a lug that is connectable to a printed wire assembly via a clinch fastener arrangement in a printed circuit board maintained by the housing.

7. The safety ground terminal apparatus of claim 1 wherein the base comprises an FTA (Field Termination Assembly) base.

8. The safety ground terminal apparatus of claim 1 wherein switching between the common ground connection or the isolated ground connection is achieved without any additional parts assembled.

9. The safety ground terminal apparatus of claim 1 further comprising a switchable ground strip that provides a visual indication of which ground is connected including the common ground connection or the isolated ground connection.

10. A system, comprising:

a grounding arrangement comprising a plurality of ground connections;

a rail;

a base of a housing; and a ground terminal operable to switch between at least one common ground connection or at least one isolated ground connection among the plurality of ground connections, wherein the ground terminal comprises a hinge point that is connectable to the base of the housing via the rail in an arrangement that allows for a disconnection from the at least one common ground connection when the at least one isolated ground connection is required and without compromising electrical contact, wherein the base is arranged in a manner such that the hinge point allows for a movement of a circular protruding portion to maintain a screw to connect the ground terminal with the common ground connection, and wherein when the isolated ground connection is required, a separate ground wire is connected via a clinch nut configuration.

11. The system of claim 10 wherein the grounding arrangement is securable to avoid accidental switching of a ground connection among the plurality of ground connections when the system is active.

12. The system of claim 10 wherein the ground terminal provides a watertight ground connection irrespective of a type of ground connection requirement.

13. The system of claim 10 further comprising a separate ground wire with a lug that is connectable to a printed wire assembly via clinch fastener arrangement in a printed circuit board maintained by the housing.

14. The system of claim 10 wherein the base comprises an FTA (Field Termination Assembly) base and the rail comprises a DIN rail.

15. The system of claim 10 wherein switching between the common ground connection or the isolated ground connection is achieved without any additional parts assembled.

16. The system of claim 10 further comprising a switchable ground strip that provides a visual indication of which ground is connected including the common ground connection or the isolated ground connection.

17. A method of operating a safety ground terminal apparatus, comprising:

switching a ground terminal between a common ground connection or an isolated ground connection, wherein the ground terminal comprises a hinge point that is connectable to a base of a housing via a rail in an arrangement that allows for a disconnection from the common ground connection when the isolated ground connection is required and without compromising electrical contact, wherein the base is arranged in a manner such that the hinge point allows for a movement of a circular protruding portion to maintain a screw to connect the ground terminal with the common ground connection, and wherein when the isolated ground connection is required, a separate ground wire is connected via a clinch nut configuration.

18. The method of claim 17 wherein the switching between the common ground connection or the isolated ground connection is achieved without any additional parts assembled.

19. The method of claim 17 further comprising using a switchable ground strip for a visual indication of which ground is connected including the common ground connection or the isolated ground connection.

20. The method of claim 17 wherein the ground terminal provides a watertight ground connection irrespective of a type of ground connection requirement.

\* \* \* \* \*